(12) United States Patent
Ichinose

(10) Patent No.: US 6,215,169 B1
(45) Date of Patent: Apr. 10, 2001

(54) SEMICONDUCTOR DEVICE WITH ADHESIVE TAPE NOT OVERLAPPING AN OPENING IN THE UPPERMOST SURFACE OF THE SEMICONDUCTOR ELEMENT SURFACE

(75) Inventor: Michihiko Ichinose, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/310,725

(22) Filed: May 13, 1999

(30) Foreign Application Priority Data

May 15, 1998 (JP) .................................................. 10-133790

(51) Int. Cl.⁷ ..................................................... H01L 29/00
(52) U.S. Cl. .......................... 257/529; 257/632; 257/668; 257/673
(58) Field of Search .................................. 257/529, 632, 257/668, 783

(56) References Cited

FOREIGN PATENT DOCUMENTS

| 4-287356 | 10/1992 | (JP) . |
| 5-29528 | 2/1993 | (JP) . |
| 7-86477 | 3/1995 | (JP) . |
| 7-221259 | 8/1995 | (JP) . |
| 8-31879 | 2/1996 | (JP) . |
| 8-162598 | 6/1996 | (JP) . |
| 9-153585 | 6/1997 | (JP) . |
| 9-260535 | 10/1997 | (JP) . |
| 10-32287 | 2/1998 | (JP) . |
| 11-111739 | 4/1999 | (JP) . |

Primary Examiner—J. Carroll
(74) Attorney, Agent, or Firm—McGinn & Gibb, PLLC

(57) ABSTRACT

In a semiconductor device, the adhesive layer of a tape that is adhered to the surface of a chip is disposed so that there is no overlap with an aperture in the uppermost surface of a semiconductor element. With the usual type of tape, the tape is kept at a distance of at least 0.1 mm from the cover aperture in the surface of the semiconductor element, and in the case in which there are two covers, the tape is kept at a distance of at least 0.1 mm from an aperture at the uppermost surface of the semiconductor element. The aperture includes either a fuse aperture or a bonding bad and fuse aperture.

7 Claims, 5 Drawing Sheets

Fig. 3
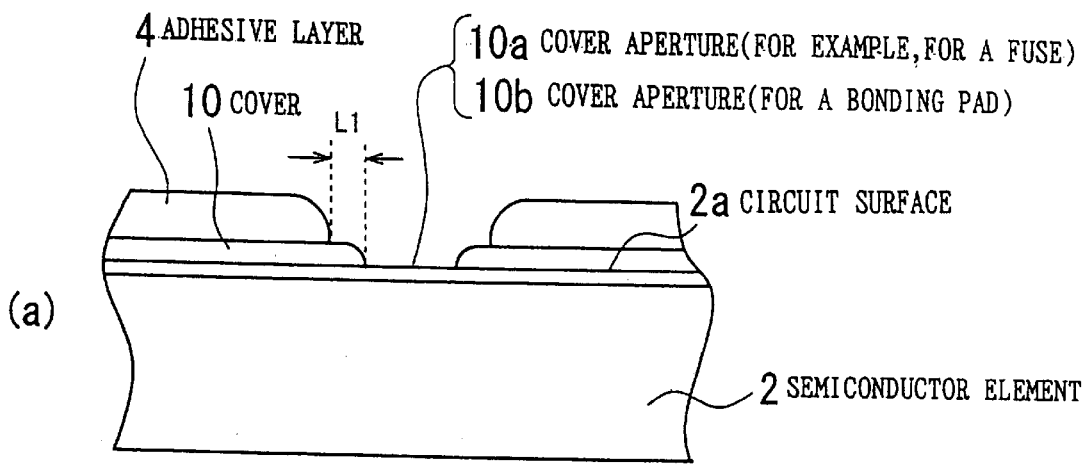
(a)
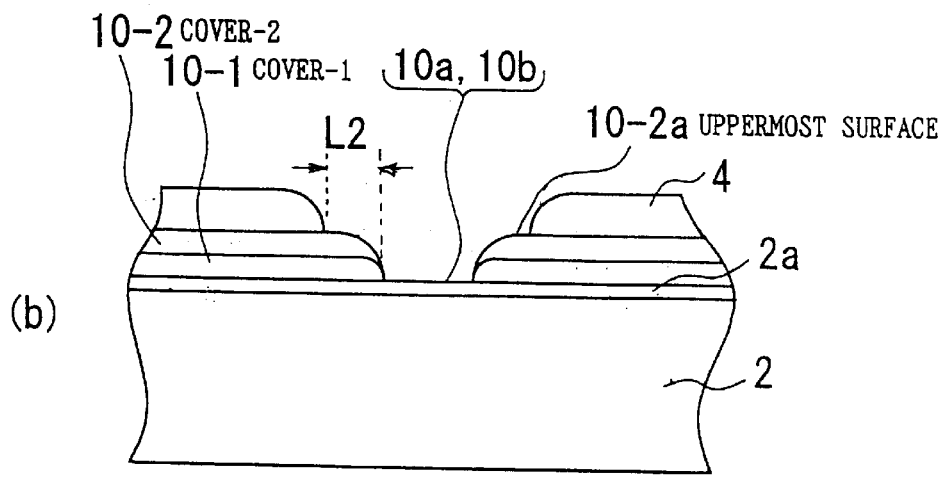
(b)

Fig. 4
(a) 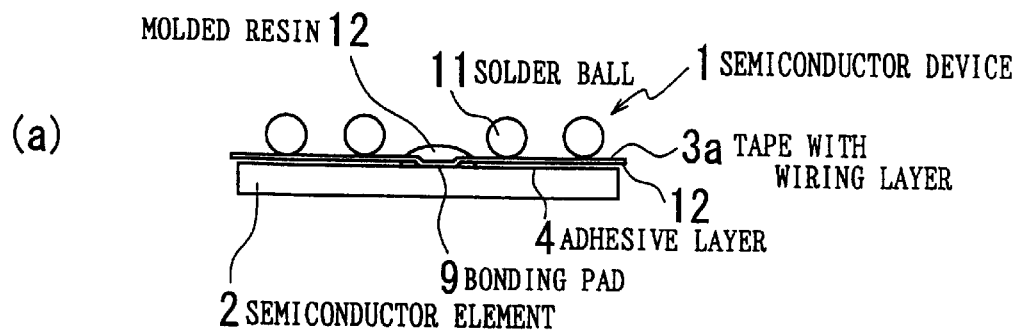
(b) 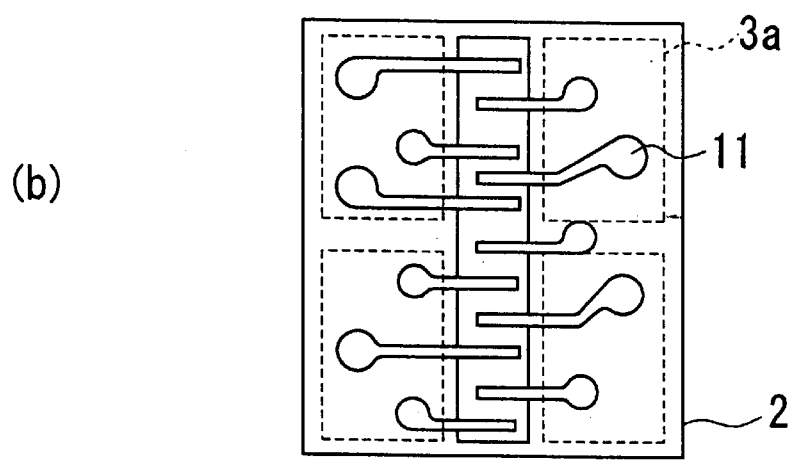
(c) 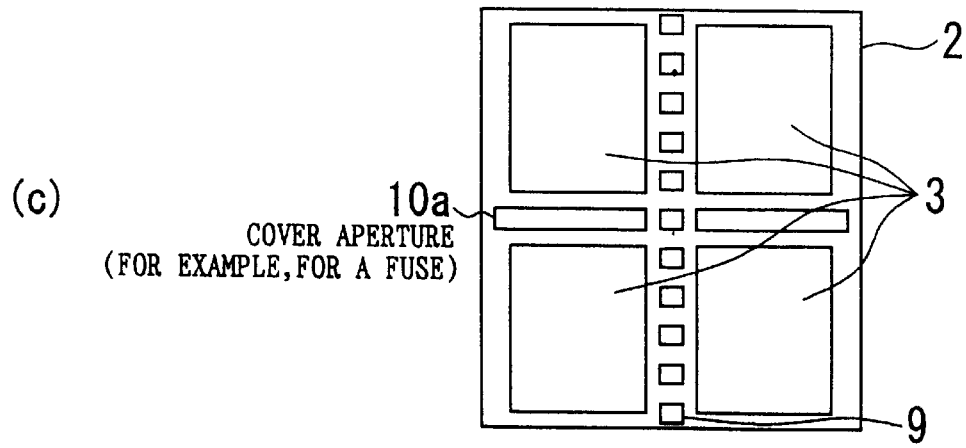

Fig. 5
(a) PRIOR ART
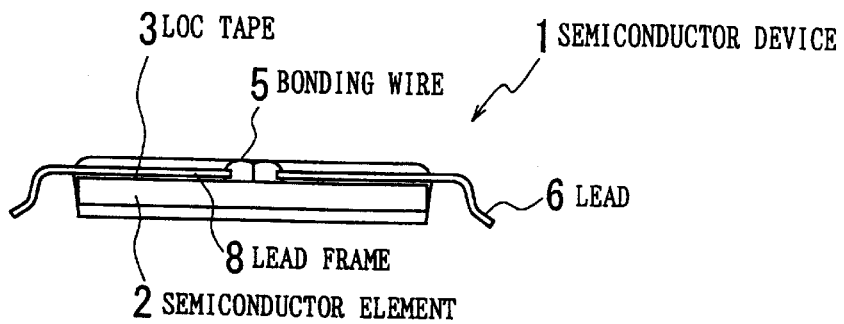
(b) PRIOR ART
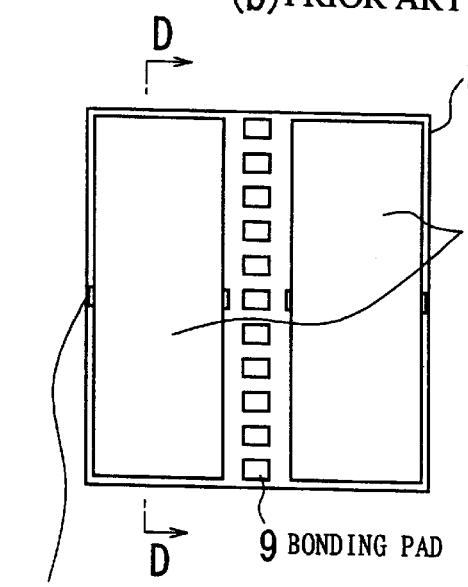
(c) PRIOR ART
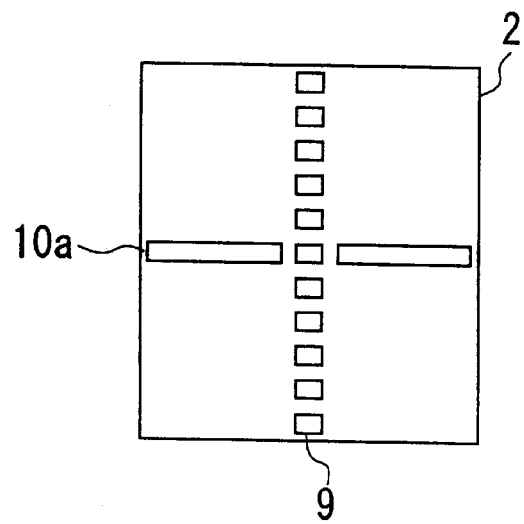
(d) PRIOR ART
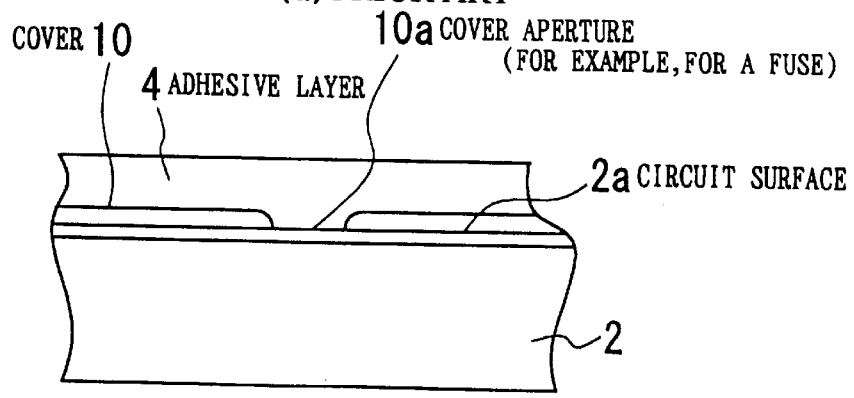

SEMICONDUCTOR DEVICE WITH ADHESIVE TAPE NOT OVERLAPPING AN OPENING IN THE UPPERMOST SURFACE OF THE SEMICONDUCTOR ELEMENT SURFACE

BACKGROUND OF THE INVENTION

1. Field of the Invention

The present invention relates to a semiconductor device in which a tape that is adhered to the surface of a chip, the adhesive layer of this tape, for example a tape of LOC structure (lead on chip tape), being disposed so as not to overlap with an opening in a cover of the semiconductor element surface.

2. Description of the Related Art

A tape of LOC structure (lead on chip tape) usually has a three-layer structure, with adhesive on the front and back of a base material. The adhesive used is often a thermally cured adhesive or a thermally plastic adhesive. Such an adhesive contains a large amount of ionic impurities. As is the same with the LOC tape, CSP (chip scale package) tape that has an wiring layer is adhered to the front surface of the chip, using an adhesive or the like that has insulating properties, the semiconductor element bonding pads and tape interconnect layer being connected by means of wire bonding that uses gold wires, thereby serving to make connection from the interconnect layer to the outside, for example, by ball terminals.

With reference to the prior art references, we will briefly describe them as follows In the Japanese Unexamined Patent Publication No.08-031879, the semiconductor device includes a semiconductor chip having a surface arranged with inner wiring terminals, a wiring layer fixed through an adhesive layer to the surface of the semiconductor chip, and outer wiring terminals arranged on the periphery of the semiconductor chip. The surface wiring layer has one end part connected electrically with the inner wiring terminals and the other end part connected electrically with the outer wiring terminals. For example, a copper foil TAB lead of 35 µm thick has one end thermo-compressed to the inner wiring terminal through a gold bump and the other end extending outward from the circumference of the semiconductor chip and thermo-compressed to the lead frame. The TAB lead is bonded to the surface of the semiconductor chip through the adhesive layer.

The Japanese Unexamined Patent Publication No.08-162598 recites a semiconductor device having a structure formed by bonding the inner lead of the lead frame on a semiconductor chip or a heat-radiating plate via an adhesive tape to ensure sufficient bonding between an inner lead of a lead frame and a bonding wire to make the bonding suitable for high mounting density. A recess is formed near a bond part of an upper surface of each inner lead of a lead frame to be bonded via an adhesive tape on a semiconductor chip, which bond part is to be bonded to a bonding wire. Upon bonding, the tip side of the inner lead is made not to sink in the adhesive tape by the recess so that the contact area between the bonding wire and the inner lead is not decreased.

The Japanese Unexamined Patent Publication No.09-260535 provides a ball grid array type of semiconductor package, and this is composed of a semiconductor chip where a bonding pad is made, an elastomer which is bonded to the semiconductor chip , a flexible wiring board which is bonded to the elastomer and in which wiring whose lead is connected to the bonding pad of the semiconductor pad is made, a solder resist which is made on the main surface of the flexible wiring board, and a bump which is connected to the bump land of the wiring .This is the so-called surface wiring structure where the elastomer is bonded to the semi-conductor chip side of the tape of the flexible wiring board, and besides the solder resist is made on the solder bump side of the wiring.

The Japanese Unexamined Patent Publication No.10-032287 provides a resin-sealed semiconductor device which is equipped with a semiconductor element, leads connected to the circuit-formed surface of the element and arranged above it, gold wires which connect the semiconductor device with the leads, and an insulating tape provided between a part of the leads and the semiconductor element to fix the leads to the semiconductor element. A frame-shaped dam bar nearly equal in external shape to the circuit-formed surface is fixed onto the circuit-formed surface through the intermediary of the adhesive tape so as not to come into contact with the leads. Molding resin is filled inside the dam bar to seal up the circuit-formed surface without covering the upside of the leads, and the surface except the circuit-formed surface is kept exposed.

FIG. 5(*a*) is a cross-sectional view of a prior art semiconductor device, FIG. 5(*b*) is a plan view thereof, which shows the condition in which the lead frame has been removed from the structure shown in FIG. 5(*a*), FIG. 5(*c*) is a plan view showing the condition in which the tape is removed, and FIG. 5(*d*) is an enlarged cross-sectional view along the line D—D that is shown in FIG. 5(*b*).

The LOC tape 3 exists on the active surface of the semiconductor element 2, that is, on the top of the so-called circuit surface 2*a*, the element 2 being fixed to the lower surface thereof and an internal lead being fixed to the upper surface thereof. The internal lead 6 and the bonding pad 9 of the semiconductor element 2 are electrically connected by means of a bonding wire (made of gold) 5. Therefore, the LOC tape 3 is of a shape that avoids the bonding pad 9. However, the LOC tape 3 is adhered so as to overlap the cover aperture part (fuse and the like) 10*a* of the outermost surface of the semiconductor element other than the bonding pad location.

The LOC tape 3 usually has a three-layer structure, with adhesive on the front and back of a base material. The adhesive used is often a thermally cured adhesive or a thermally plastic adhesive. Such an adhesive contains a large amount of ionic impurities.

As described above, if an LOC tape is shaped so that the LOC tape does not overlap with the cover aperture of the semiconductor element, there is no corrosion of fine interconnects caused by impurities in the LOC tape.

The above is also true with regard to CSPs (chip scale packages). In the case of a CSP, a tape that has an wiring layer is adhered to the front surface of the chip, using an adhesive or the like that has insulating properties, the semiconductor element bonding pads and tape interconnect layer being connected by means of wire bonding that uses, for example, gold wires, thereby serving to make connection from the interconnect layer to the outside, for example, by ball terminals.

In the same manner as noted for an LOC tape, because the adhesive of this tape that has an interconnect layer for use in an CSP is adhered to the cover aperture part of the uppermost surface of the semiconductor element other than the bonding pad, impurities in the tape contaminate and cause broken connections in such thin interconnect parts as the fuses at the cover aperture at the uppermost surface of the semiconductor element.

Accordingly, it is an object of the present invention to provide a semiconductor device wherein the adhesive layer of an LOC (lead on chip) tape that is adhered to the chip surface is disposed so that it does not overlap onto the cover aperture of the surface of the semiconductor element.

SUMMARY OF THE INVENTION

In order to achieve the above-noted object, the present invention adopts the following basic technical constitution.

A semiconductor device according to the present invention has a tape that is adhered to the surface of the chip so that it is disposed in a manner that it does not overlap with the cover aperture of the semiconductor surface.

In the present invention, it is desirable that the above-noted tape be at least 0.1 mm distant from the cover aperture of the semiconductor element surface, and further that, in the case in which there are two or more covers that overlap, the tape be at least 0.1 mm distant from the cover on the uppermost surface of the semiconductor element.

It is also desirable that the above-noted aperture includes a fuse aperture, or that it includes a bonding pad part and fuse aperture.

BRIEF DESCRIPTION OF THE DRAWINGS

FIG. 3(a) is an enlarged cross-sectional view that shows the distance between the adhesive layer and the cover aperture for the case in which there is one cover, and FIG. 3(b) is an enlarged cross-sectional view that shows the distance between the adhesive layer and the cover aperture on the uppermost surface for the case in which there are two covers.

FIG. 4(a) is a cross-sectional view of a second embodiment of the present invention, FIG. 4(b) is a plan view of the embodiment shown in FIG. 4(a), and FIG. 4(c) is a plan view that shows the condition in which the interconnect layer has been removed from FIG. 4(b).

FIG. 5(a) is a cross-sectional view that shows a semiconductor device of the past, FIG. 5(b) is a plan view that shows the condition in which the lead frame has been removed from the cross-sectional view that is shown in FIG. 5(a), FIG. 5(c) is a plan view that shows the condition in which the tape is removed from the cross-sectional view that is shown in FIG. (b), and FIG. 5(d) is an enlarged cross-sectional view along the line D—D that is shown in FIG. 5(b).

DESCRIPTION OF THE PREFERRED EMBODIMENTS

Embodiments of the present invention are described below in detail, with reference being made to the relevant accompanying drawings.

Figure 1:
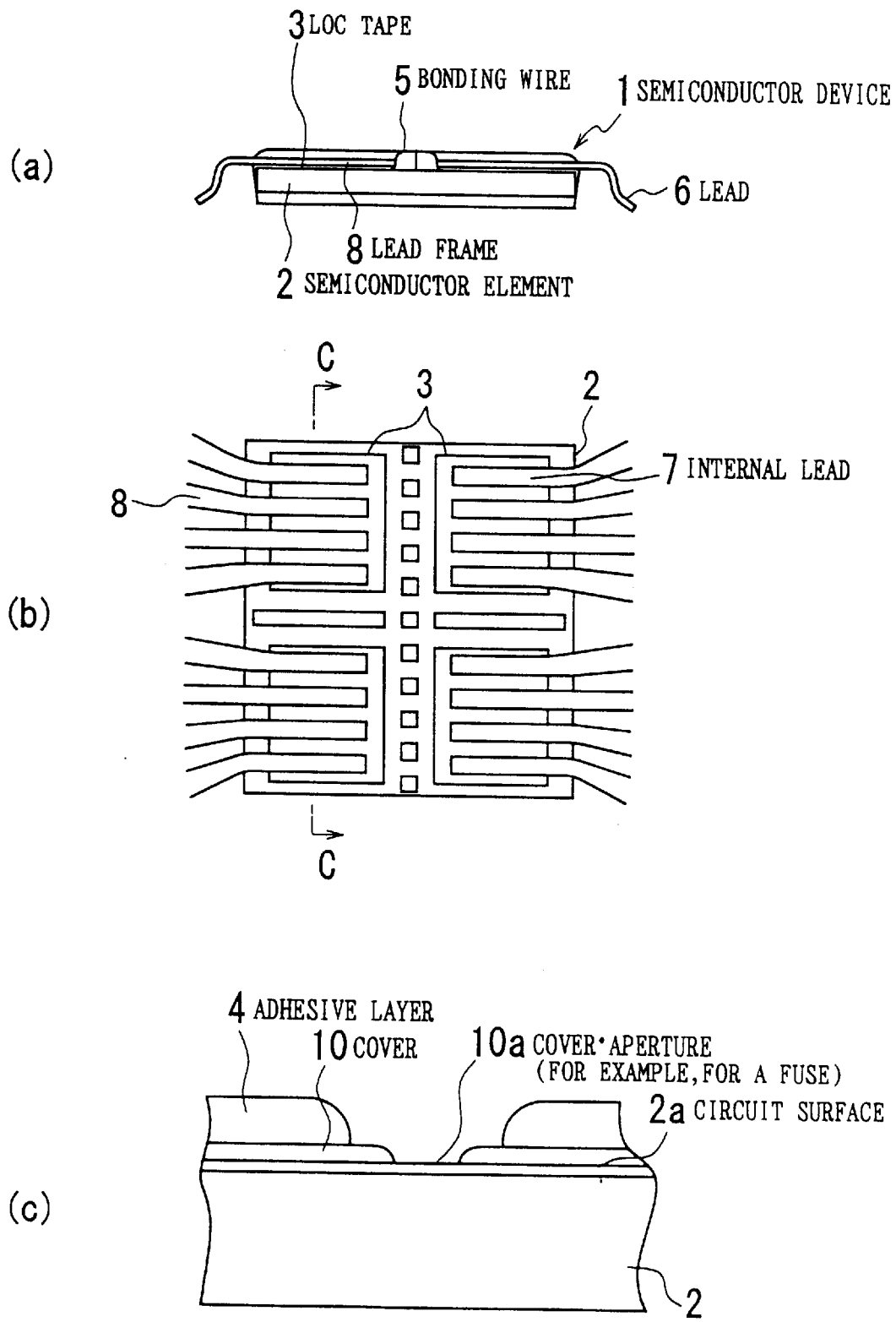
FIG. 1(a) is a side cross-sectional view of an embodiment of a semiconductor device according to the present invention.
FIG. 1(b) is a plan view thereof.
FIG. 1(c) is an enlarged cross-sectional view along the line C—C that is shown in FIG. 1(b).

FIG. 1(a) is a cross-sectional view that shows an embodiment of a semiconductor device according to the present invention, FIG. 1(b) is a plan view thereof, and FIG. 1(c) is an enlarged cross-sectional view along the line C—C that is shown in FIG. 1(b). FIG. 2(a) is a plan view that shows the internal leads, lead frame, and LOC tape before being mounted onto a semiconductor element during the assembly of the embodiment shown in FIG. 1, FIG. 2(b) is a plan view that shows the above-noted elements after mounting, and FIG. 2(c) is a plan view that shows the positional relationship between the element and the tape at the aperture, with the lead frame removed. FIG. 3(a) is an enlarged cross-sectional view that shows the distance between the adhesive layer and the cover aperture for the case in which there is one cover, and FIG. 3(b) is an enlarged cross-sectional view that shows the distance between the adhesive layer and the cover aperture on the uppermost surface for the case in which there are two covers.

Figure 2:
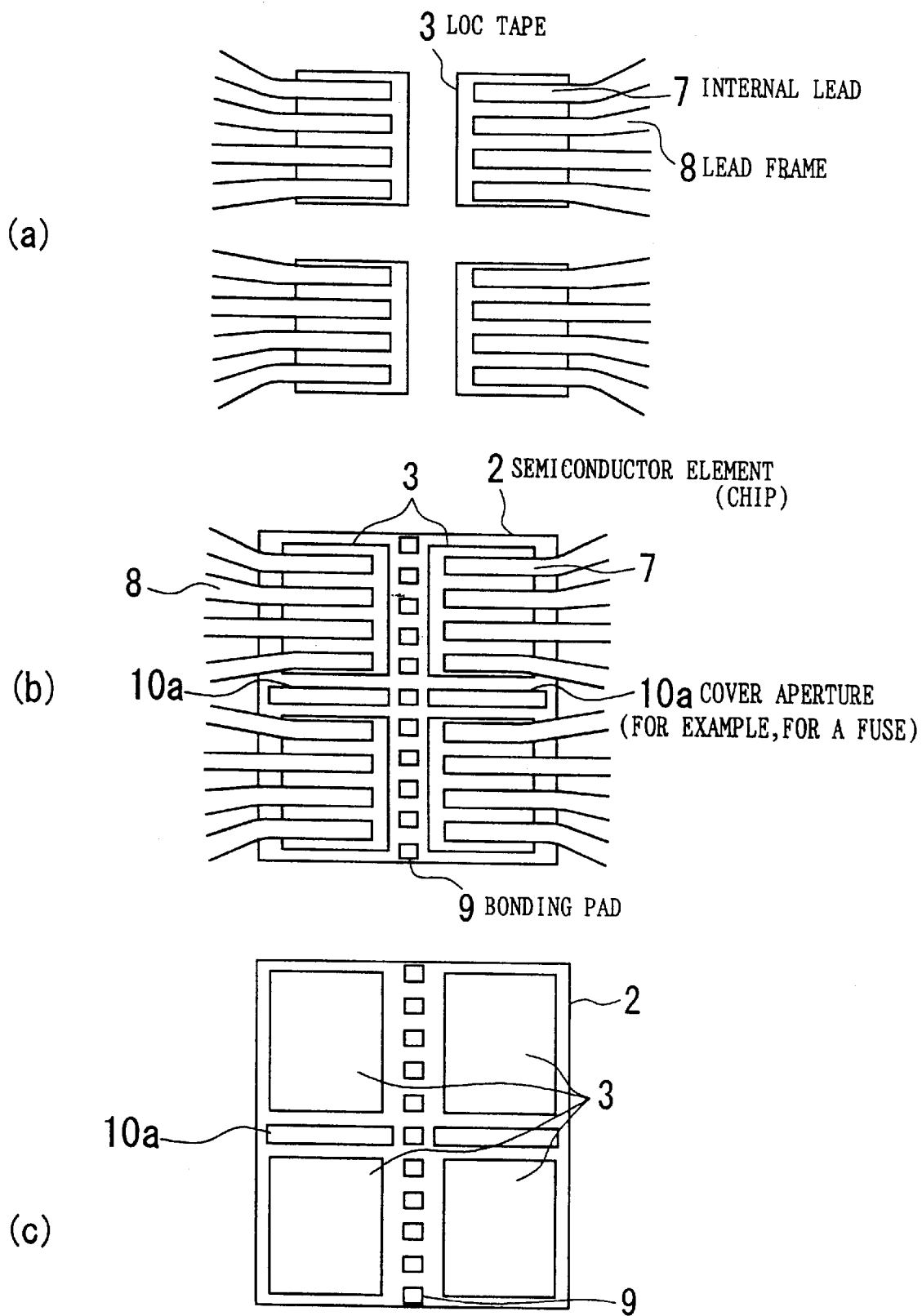
FIG. 2(a) is a plan view that shows the internal leads, lead frame, and LOC tape before being mounted onto a semiconductor element during the assembly of the embodiment shown in FIG. 1.
FIG. 2(b) is a plan view that shows the above-noted elements after mounting.
FIG. 2(c) is a plan view that shows the positional relationship between the element and the tape at the aperture, with the lead frame removed.

As can be understood from FIG. 1 through FIG. 3, in this embodiment of the present invention, in a semiconductor device having an LOC structure, that is, having a structure in which internal leads exist on the active (circuit) surface of a semiconductor element, the LOC tape does not exist over any cover aperture of the uppermost surface of the semiconductor element (that is, over any aperture, such as for bonding pads or fuses).

An LOC tape 3 exists over a circuit surface 2a of a semiconductor element 2, the semiconductor element 2 behind fixed thereby to the lower surface thereof, and the internal leads 7 being fixed to the upper surface thereof. The internal leads 7 and the bonding pads 9 of the semiconductor element 2 are electrically connected by bonding wires 5, which are made of gold, so that, just as in the past, the LOC tape 3 is of a shape that avoids the bonding pads 9. Additionally, as shown in FIG. 1, it is of a shape that avoids all the cover apertures (such as for fuses) in the uppermost surface of the semiconductor element 2. The purpose of doing this is described below.

Usually, an LOC tape is of a 3-layer structure, comprising a base material, onto the front and reverse surfaces of which are adhesive layers. This adhesive is often a thermally cured or thermally plastic adhesive, and such adhesives contain a large amount of ionic impurities.

The adhesive layers and the cover aperture part of the uppermost surface of the semiconductor elements, to allow for the accuracy of the apparatus that adheres the tape to the semiconductor element, there being extrusion of the adhesive therefrom, are usually at a distance of 0.1 mm or greater. Because the LOC tape 3 does not overlap with the cover apertures, such as those for fuses, in the uppermost surface of the semiconductor element, there is no danger that impurities from the LOC tape will cause corrosion of fine wires such as fuses at the cover apertures in the uppermost surface of the semiconductor element.

The method of manufacturing the above-noted embodiment of the present invention will be described next. In the semiconductor device 1 according to the present invention, with the lead frame 8, similar to a lead frame 8 for an LOC structure, as shown in FIG. 2(a), the LOC tape 3 is adhered to the reverse surface of the lead frame 8. The semiconductor element 2, as shown in FIG. 2(b), is bonded from the reverse surface of the lead frame 8 to the LOC tape 3 that is adhered to the internal leads 7. As shown in FIG. 3(a), when the number of the surface cover 10 of the semiconductor element 2 is only one, the LOC tape 3 is designed so as to have a shape that avoids overlapping with the cover apertures 10a and 10*b* of the cover 10. Further, when the number of the surface cover 10 of the semiconductor element 2 is two, the LOC tape 3 is also designed so as to have a shape that avoids overlapping with the cover apertures 10*a* and 10*b* of the cover 10-2 which corresponds to the uppermost surface 10-2*a* of a chip before the LOC tape is adhered, as shown in FIG. 3(*b*). When performing the operation of adhering the semiconductor element 2 to the LOC tape 3, a mounting apparatus positions both the lead frame 8 and the semiconductor element 2 so that the LOC tape 3 does not overlap with any of the cover apertures in the uppermost surface of the semiconductor element.

Next, a second embodiment of the present invention will be described.

FIG. 4(*a*) is a cross-sectional view that shows the second embodiment of the present invention, FIG.(*b*) is a plan view thereof, and FIG. 4(*c*) is a plan view that shows the condition in which the wiring layer has been removed from the condition shown in FIG. 4(*b*).

Whereas a semiconductor device having an LOC structure was presented as the first embodiment, there are other types of semiconductor devices that have a tape that is adhered with an adhesive to a surface of an element.

In the second embodiment of the present invention, this is an adhesive layer in a CSP (chip scale package). As shown in FIG. 4(*a*), in a CSP a tape 3*a* having a wiring layer is adhered to a semiconductor element 2 by an adhesive layer 4, the wiring layer and the bonding pads being joined together, and solder balls 11 being fixed to the wiring layer. The mounting operation is performed by using solder reflow to fuse the solder balls 11 to the substrate. In the case of the CSP package as well, as shown in FIG. 4(*a*), the tape 3*a*, which has the adhesive layer 4 over almost all of its surface, with the exception of the locations of the bonding pads 9, is adhered to the surface of the semiconductor element (chip) 2.

In this case as well, similar to the case of the LOC tape 3, if the adhesive layer 4 overlaps with the apertures 10-1 and 10-2 of the aperture covers 10 of the uppermost surface 10-2*a* of the semiconductor element 2, ion impurities contained in the adhesive layer will corrode the fine wires such as fuses at the cover apertures of the uppermost surface of the semiconductor element. However, as shown in FIG. 4(*c*), the shape is such that the adhesive layer avoids overlapping with the cover apertures of the uppermost surface of the semiconductor element 2. By doing this, it is possible to avoid corrosion of fine wires, such as fuses, by the ionic impurities contained in the adhesive layer.

As described in detail above, in the present invention, the adhesive layer of the tape that is adhered to the surface of the chip is disposed so as to avoid overlap with the cover apertures on the surface of the semiconductor element and, by adopting a structure in which at the cover aperture parts of the uppermost surface of the semiconductor element the distance between the adhesive layer of the tape and the semiconductor element is usually 0.1 mm or greater, it is possible to achieve a semiconductor device in which fine wires such as fuses at the cover aperture of the uppermost surface of the semiconductor element are not adversely affected by impurities in the LOC tape.

What is claimed is:

1. A semiconductor device comprising:

a tape that is adhered to a chip surface disposed so that an adhesive layer of said tape does not overlap with an aperture in the uppermost surface of a semiconductor element, said aperture having no electrical connection with a lead frame.

2. A semiconductor device according to claim 1, wherein said tape is at a distance of 0.1 mm or greater from said aperture in the uppermost surface of said semiconductor element.

3. A semiconductor device according to claim 1, wherein in a case in which said semiconductor device has two or more apertures, said tape is at a distance of 0.1 mm or greater from said apertures in the uppermost surface of said semiconductor element.

4. A semiconductor device according to claim 1, wherein said aperture includes an aperture for a fuse.

5. A semiconductor device according to claim 1, wherein said semiconductor element comprises a semiconductor chip.

6. A semiconductor device according to claim 1, wherein said tape has a wiring layer and an insulating layer.

7. A semiconductor device wherein a tape that is adhered to a chip surface is disposed so that an adhesive surface of said tape is at a distance of 0.1 mm or greater from an aperture that includes an aperture for a bonding pad and a fuse in the uppermost surface of a semiconductor element, said aperture having no electrical connection with a lead frame.

* * * * *